(12) United States Patent
Yang et al.

(10) Patent No.: US 7,654,311 B2
(45) Date of Patent: Feb. 2, 2010

(54) THERMAL MANAGEMENT OF SYSTEMS HAVING LOCALIZED REGIONS OF ELEVATED HEAT FLUX

(75) Inventors: Bao Yang, Silver Spring, MD (US); Avram Bar-Cohen, Washington, DC (US)

(73) Assignee: University of Maryland, College Park, MD (US)

( * ) Notice: Subject to any disclaimer, the term of this patent is extended or adjusted under 35 U.S.C. 154(b) by 157 days.

(21) Appl. No.: 11/495,667

(22) Filed: Jul. 31, 2006

(65) Prior Publication Data

US 2006/0260793 A1 Nov. 23, 2006

Related U.S. Application Data

(63) Continuation-in-part of application No. 11/253,593, filed on Oct. 20, 2005, now Pat. No. 7,290,596.

(60) Provisional application No. 60/620,357, filed on Oct. 20, 2004.

(51) Int. Cl.
*F28F 7/00* (2006.01)
*H05K 7/20* (2006.01)
(52) U.S. Cl. .................. 165/185; 165/80.2; 361/702
(58) Field of Classification Search ............. 165/80.1, 165/80.2, 146, 185; 361/702, 704, 715; 257/717, 257/720
See application file for complete search history.

(56) References Cited

U.S. PATENT DOCUMENTS

| | | | |
|---|---|---|---|
| 5,456,081 A | 10/1995 | Chrysler et al. | |
| 5,714,791 A | 2/1998 | Chi et al. | |
| 5,956,569 A | 9/1999 | Shiu et al. | |
| 6,162,659 A | 12/2000 | Wu | |
| 6,256,996 B1 | 7/2001 | Ghoshal | |
| 6,347,521 B1 | 2/2002 | Kadotani et al. | |
| 6,432,809 B1 * | 8/2002 | Tonti et al. | 438/618 |
| 6,476,483 B1 * | 11/2002 | Adler et al. | 257/713 |
| 6,499,306 B2 | 12/2002 | Gillen | |
| 6,598,403 B1 | 7/2003 | Ghoshal | |
| 6,686,532 B1 | 2/2004 | Macris | |
| 6,712,258 B2 | 3/2004 | Ghoshal | |
| 6,743,972 B2 | 6/2004 | Macris | |
| 6,822,325 B2 * | 11/2004 | Wong | 257/717 |
| 6,826,916 B2 | 12/2004 | Shimada et al. | |

(Continued)

*Primary Examiner*—Teresa J Walberg
(74) *Attorney, Agent, or Firm*—Rosenberg, Klein & Lee

(57) ABSTRACT

A thermal management system (300) includes a first heat transfer body (330) for providing a opposing heat flux to at least one localized region of elevated heat flux residing in adjacency to a region of lesser flux, such as on a surface (315a) of a circuit die (315) due to a integrated circuit hotspot (310). A contact (320, 321 962a, 962b, 970a, 970b or 950) defines a thermal conduction path for the opposing flux. A second heat transfer body (350) is in a heat transport relationship with the first heat transfer boy (330) and a second heat transport relationship with the region of lesser heat flux. In such arrangement, each region of heat flux is provided a thermal solution commensurate with the level of heat flux in the region. For example, the opposing heat flux of an active first heat transfer body (330), such as a thermoelectric cooler, may be provided at the hot-spot (310), while at the same time the lesser heat flux is absorbed by a passive second heat transfer body (350), such as a heat spreader.

23 Claims, 20 Drawing Sheets

U.S. PATENT DOCUMENTS

| | | | |
|---|---|---|---|
| 2002/0041021 A1 * | 4/2002 | Sakamoto et al. | 257/690 |
| 2002/0174660 A1 | 11/2002 | Venkatasubramanian | |
| 2003/0017650 A1 * | 1/2003 | Armbrust et al. | 438/122 |
| 2004/0068991 A1 | 4/2004 | Banney et al. | |
| 2004/0118129 A1 | 6/2004 | Chrysler et al. | |
| 2004/0251539 A1 | 12/2004 | Faris et al. | |
| 2005/0067692 A1 | 3/2005 | Ramanathan et al. | |
| 2005/0068737 A1 | 3/2005 | Leija et al. | |
| 2005/0077619 A1 | 4/2005 | Ramanathan et al. | |

* cited by examiner

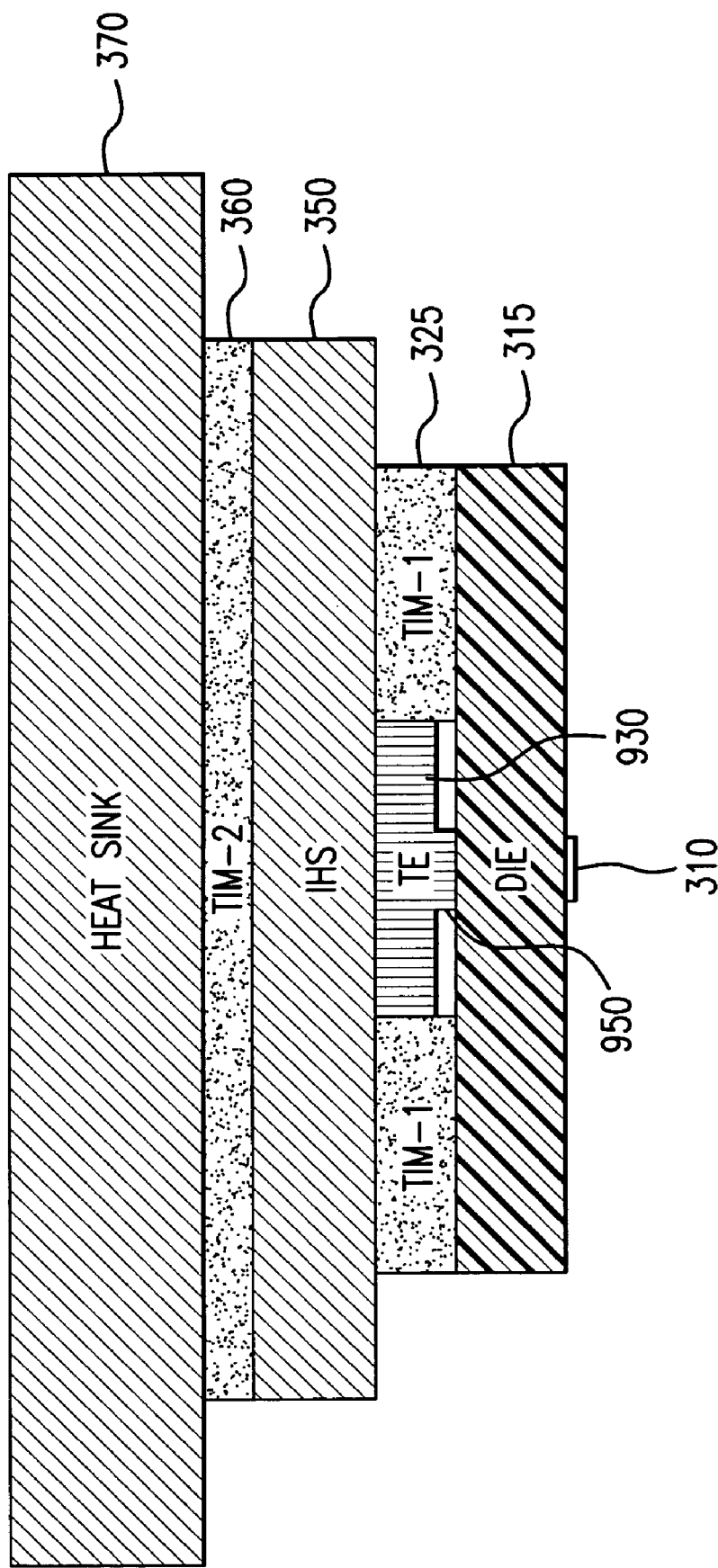

THERMAL MANAGEMENT OF SYSTEMS HAVING LOCALIZED REGIONS OF ELEVATED HEAT FLUX

RELATED APPLICATION DATA

This Application is a Continuation-in-Part of application Ser. No. 11/253,593, filed on 20 Oct. 2005 now U.S. Pat. No. 7,290,596, which itself is based on Provisional Patent Application No. 60/620,357, filed on 20 Oct. 2004.

BACKGROUND OF THE INVENTION

1. Field of the Invention

The invention described herein is most directly related to the field of heat transfer. More specifically, the invention is directed towards thermal management systems for transferring thermal energy across a boundary that includes one or more localized regions of elevated heat flux.

2. Description of the Prior Art

Present trends toward greater miniaturization of integrated circuits (IC) have provided motivation for innovative on-chip thermal management systems, in that smaller ICs have associated therewith corresponding increases in transistor densities leading to higher circuit current densities and corresponding increases in the heat flux associated therewith. Adding to modern thermal management challenges are developments in integrated circuits of mixed circuit architecture, wherein the power requirements of one or more sub-circuits is dramatically greater than the power requirements of surrounding circuits. For example, high power logic and low power memory have been integrated together in known microprocessors, resulting thereby in localized high power regions, commonly referred to as "hot-spots". Such a condition is depicted in FIG. 1, wherein the various shadings represent the heat flux emanating from that region. As is shown in the Figure, a localized region of elevated flux is illustrated at 130, which indicates the location of a hot-spot. In the illustrative IC application, the localized region of elevated flux may be a hot-spot located in the area 130 on a die 120. Consistent with traditional thermal management practice, circuit die 120 may be thermally coupled to a heat spreader 110, which is itself thermally coupled to a heat sink 100.

It is expected that the heat flux emanating from hot-spots in the next generation of microprocessors may exceed 1,000 W/cm$^2$, six times more than the average heat flux taken over the circuit die on which the hot-spot resides, with expected hot-spot temperatures to exceed by 30° C. the average die temperature. The inability for a CMOS "macrocell" to shed this excess heat from the high-heat flux hot-spot may result in a decrease in the operational speed thereof by some 10%-15%. As such, the performance of the entire chip is severely compromised and such microprocessors may experience an accelerated failure rate. In this light, it is to be noted that the traditional passive thermal management systems of the prior art are inadequate to the task of absorbing the heat of hot-spots of the anticipated technology.

Certain conventional thermal management systems, such as that shown in FIG. 2A, have sought to reduce the global temperature of an entire circuit die. In the Figure, which may be a packaging configuration commonly referred to as a "flip-chip", a thermoelectric cooler 220 is thermally coupled to a circuit die 210 through a layer of thermal grease 215. The circuit die 210 may be electrically coupled to a substrate 205, which may be shared with other circuits not shown. The thermoelectric device 220 may be in thermal contact with a heat sink 225 for dissipating the thermal energy of the cooler 220. As shown in FIG. 2B, which illustrates the configuration of FIG. 2A in simplified form, the thermoelectric device 220 is in full contact with the entire circuit die 210. Thus, to reduce the temperature of hot-spot 230 to acceptable levels, the entire circuit die 210 is also cooled to the temperature of the device 220. The inefficiency of such conventional thermal management systems as applied to the hot-spot cooling problem is readily observed by the skilled artisan and motivation towards the design of more aggressive thermal solutions for managing systems that include localized regions of elevated flux is readily apparent.

SUMMARY OF THE INVENTION

The present invention is directed to providing thermal management for systems that have localized regions of elevated heat flux adjacent to regions of lesser heat flux. In a first aspect of the invention, the thermal management system includes a first heat transfer body acting by an opposing heat flux in an opposing heat transport relationship with respect to at least one localized region of elevated heat flux located at the boundary. The first heat transfer body includes a first region terminated by the boundary at substantially the localized region of elevated heat flux and a second region displaced from physical contact with the boundary. A second heat transfer body is included which is in heat transport relationship with the first heat transfer body with the region of lesser heat flux.

In another aspect of the invention, the thermal management system includes a first layer on one side of a boundary that includes at least one localized region of elevated heat flux adjacent a region of lesser heat flux and a second layer including first heat transfer body. The first heat transfer body includes at least one first region terminated by the boundary at substantially the localized region of elevated heat flux and a second region displaced from physical contact with the boundary. A third layer includes a second heat transfer body, which is in heat transport relationship with the first heat transfer body and with the region of lesser flux.

In yet another aspect of the invention, the thermal management system is provided for transferring thermal energy across a boundary that includes at least one localized region of elevated heat flux adjacent a region of lesser flux. The system includes at least one first heat transfer body acting by a corresponding opposing heat flux in an opposing heat transport relationship with respect to a corresponding localized region of elevated heat flux. The first heat transfer body includes a first region protruding from a second region, where the first region is located substantially at the corresponding localized region of elevated heat flux. A second heat transfer body is provided to be in heat transport relationship with the first heat transfer body with the region of lesser flux.

BRIEF DESCRIPTION OF THE DRAWINGS

FIGS. 9A-9I are schematic block diagrams of alternative embodiments of the present invention.

DETAILED DESCRIPTION OF PREFERRED EMBODIMENTS

Figure 3A:
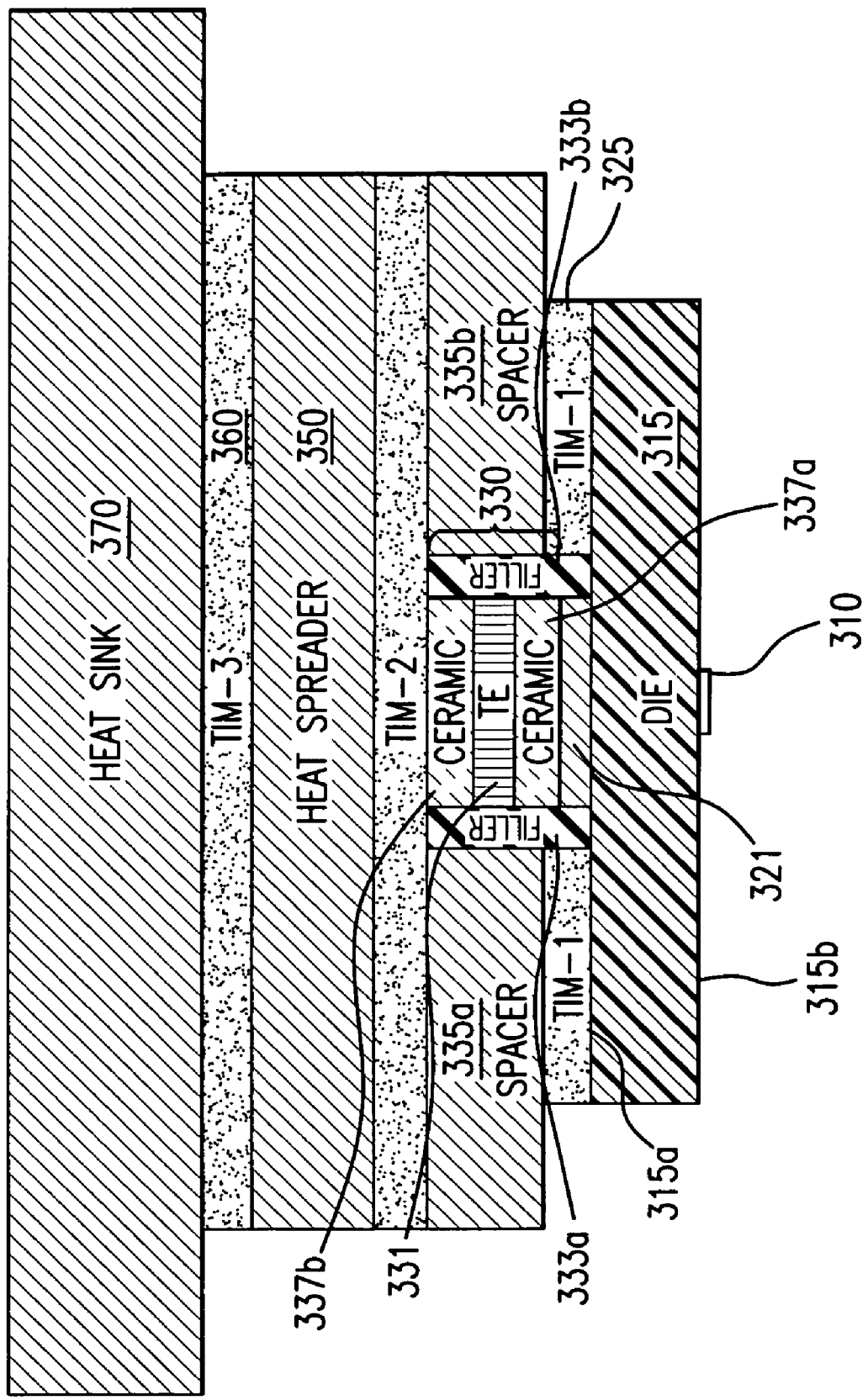
FIG. 3A is a schematic block diagram of an exemplary embodiment of a thermal management system consistent with the present invention.

Referring now to FIG. 3A, there is shown in cross-section an exemplary embodiment of the present invention for illustrating certain beneficial features thereof. It is to be noted that the embodiments described herein are given to illustrate the various aspects of the invention in view of the objectives thereof, and their presentation is not to be construed as limitation of the invention to any particular application. Other configurations and possibilities will be apparent to those skilled in the art upon reading this disclosure.

As shown in FIG. 3A, an integrated circuit (IC) die 315 has a first surface 315a and a second surface 315b. The die 315 may be composed of any material, but for purposes of explanation, the material of die 315 is of a type typical to the manufacture of ICs, such as Si or GaAs. The circuit constructed on circuit die 315 creates by virtue of its configuration a local hot-spot 310, which is characterized by a localized region of elevated heat flux. In the embodiment of FIG. 3A, hot-spot 310 is located on the surface 315b of the die 315 opposite the surface 315a on which the thermal management system 300 of the present invention is installed. However, the invention is not limited to such configuration. That is to say, thermal management system 300 may be located on either side of the die 315 such as will be described further below.

In the exemplary embodiment of FIG. 3A, surface 315a defines a boundary on which the heat flux generated by the die emanates. In the region of the hot-spot 310, the heat flux passing through the boundary 315a is elevated with respect to the heat flux traversing the boundary 315a at other locations on the die 315. In accordance with certain aspects of the invention, a first contact region 321 is positioned in physical contact with the boundary 315a at the region of elevated flux. Contact 321 defines a thermal conduction path for an opposing heat flux, as will be described, and, as such, should be formed of a material having a suitably high thermal conductivity, such as copper.

As shown in the Figure, mini-contact 320 is in physical contact not only with circuit die 315, but also with a heat transfer body 330 acting in an opposing thermal transport relationship to the localized region on the die. That is to say, in cooling applications, the heat transfer body 330 sinks heat flux from the localized region and in heating applications, the heat transfer body 330 sources heat flux to the localized region. In the exemplary hot-spot cooling application of FIG. 3A, heat transfer body 330 sinks heat flux emanating from the localized region on the die 315. In hot-spot management applications, such sinking of heat by an active device is often discussed in terms as though the device were providing an opposing flux, commonly known as a "cooling flux". The cooling flux source 330 has at its core, in the exemplary embodiment, a thermoelectric element (TE) 331, which may be any such device known in the art. Presently, numerous vendors of TEs operating on the Peltier principle offer devices of suitable size to be used with the present invention. The TE 331 may be sandwiched between two ceramic layers 337a, 337b for providing electrical isolation of the thermoelectric device 331 from surrounding electrically conductive elements, such as the contact 321 and the circuit on die 315. It is to be noted that due to the nature of Peltier devices, heat transfer body 330, when implemented by such, may be either a cooling source or a heat source simply by changing the direction in which the electric current flows.

The heat transfer body 330 may be held in position by one or more filler elements 333a, 333b to provide additional mechanical stability to the structure of thermal management system 300. In certain embodiments of the invention, the filler elements are excluded and the space is occupied by air or some other gas. However, if such filler elements are used, the filler material should both provide electrical isolation as well as thermal isolation from the surrounding components. Indeed, it is an object of the invention to minimize the parasitic thermal load on the heat transfer body 330 so as to minimize the power requirements of thereof, while providing maximum cooling or heating to the localized region. Although the hot-spot 310 has a very high heat flux, it dissipates only a small fraction of the total power generated in the die 315. Thus, the power consumption of the heat transfer body contributes only a small fraction of the total heat dissipated by the heat sink 370 even if the body possesses a low coefficient of performance (COP).

Figure 1:
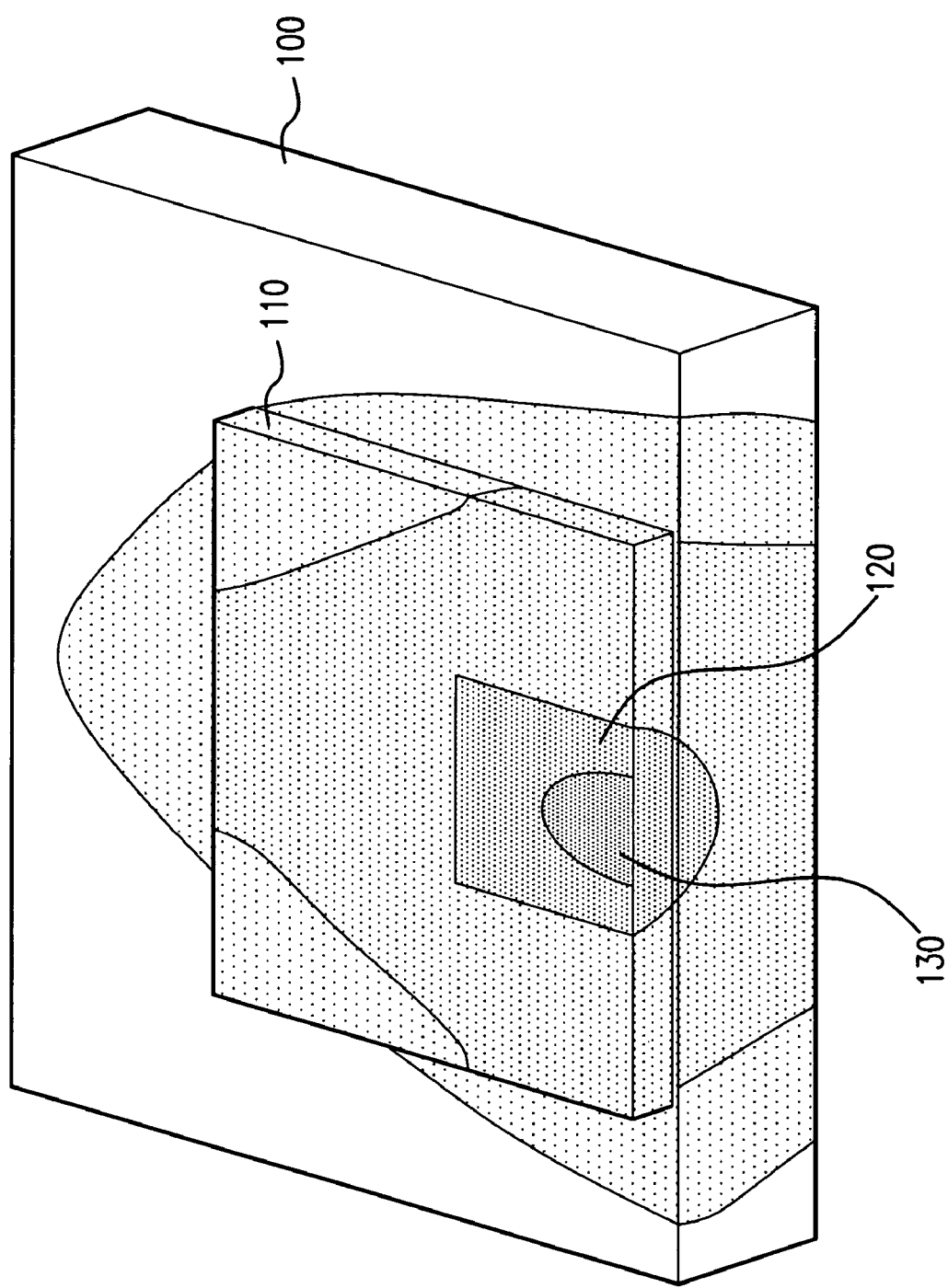
FIG. 1 is an illustration of the temperature levels across an integrated circuit package in the presence of a localized region of elevated heat flux.
Figure 2A:
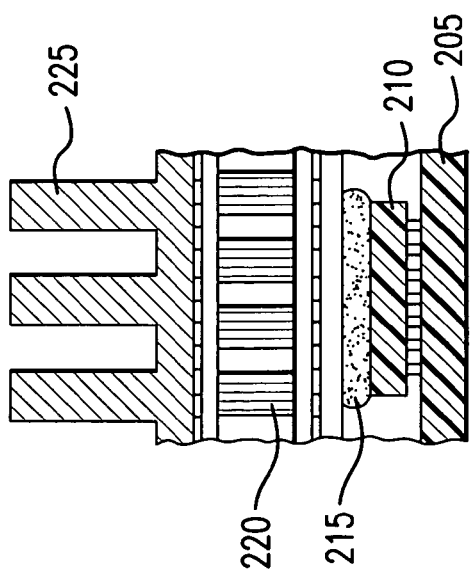
FIGS. 2A-2C are diagrams illustrating a typical thermal management system of the prior art.
Figure 2B:
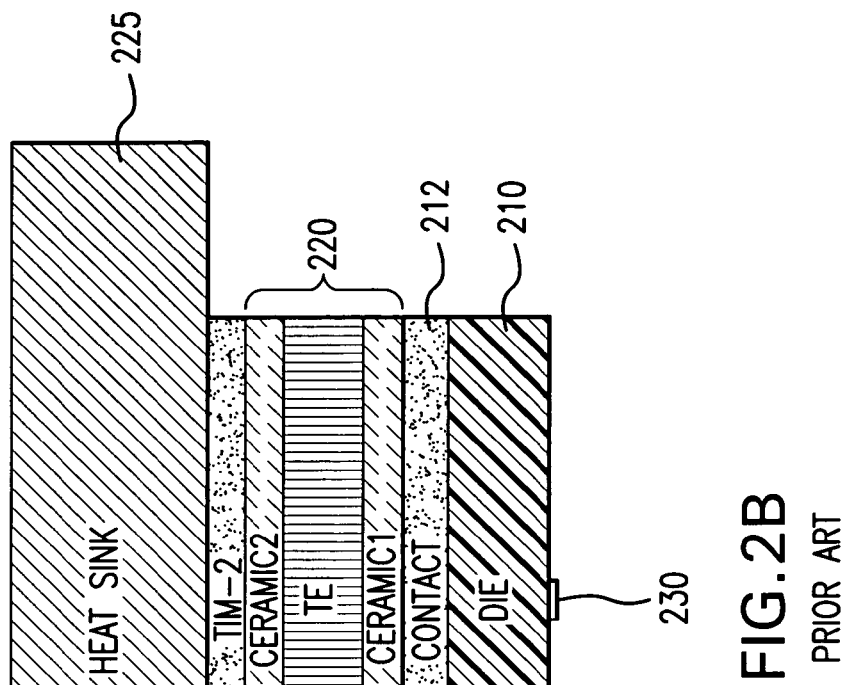
Figure 2C:
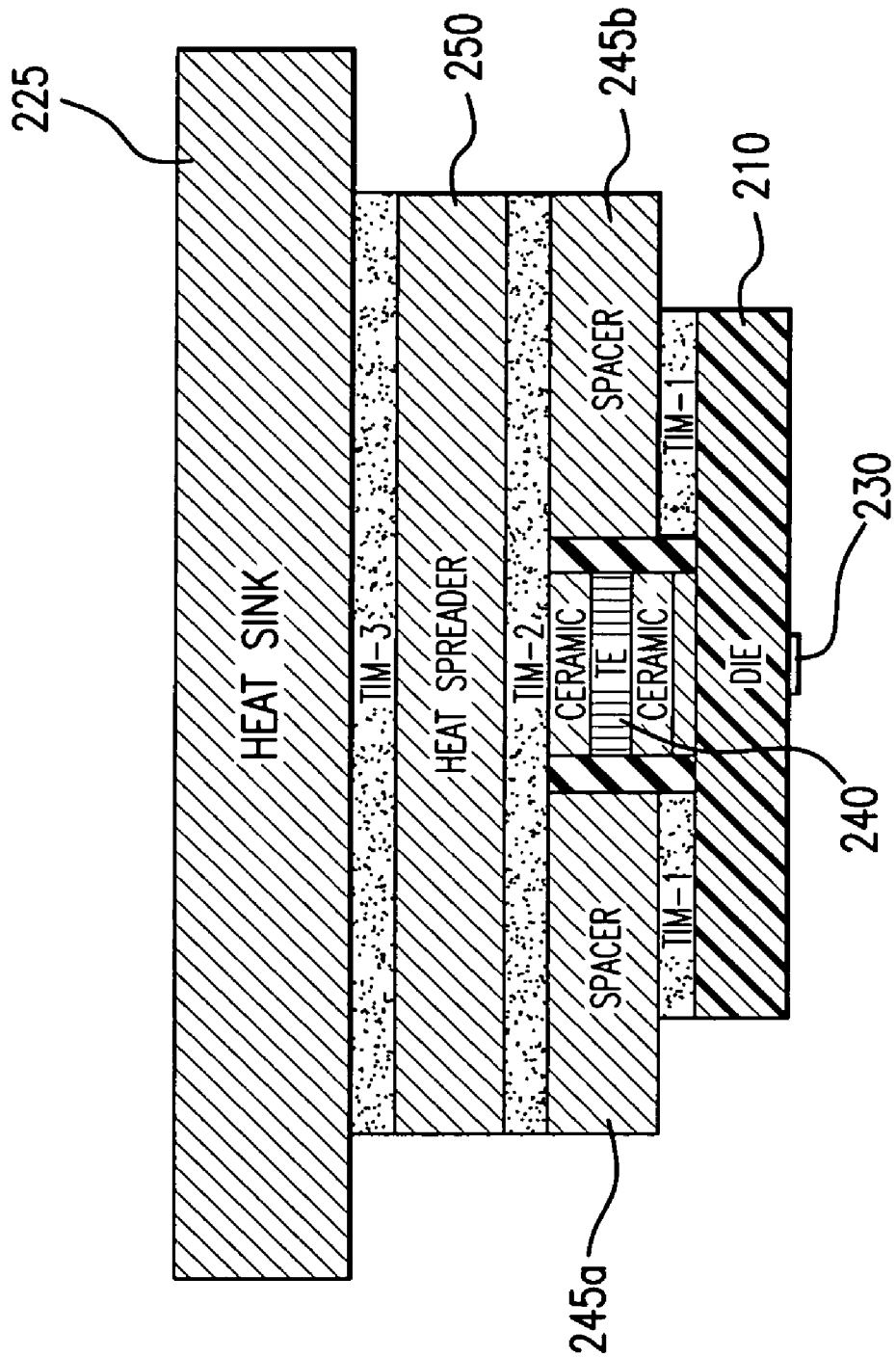

In accordance with certain aspects of the invention, a second heat transfer body, shown as heat spreader 350, is provided to implement broader thermal management of the die 315. As is shown in FIG. 1, the localized region of elevated flux at 130 is adjacent a region of lesser heat flux, which should also be transported away from the die 120. Referring once again to FIG. 3A, the second heat transfer body 350 fulfills this function by a heat transport relationship with the region of lesser flux. In certain embodiments of the invention, the heat transport relationship is conduction, which is achieved by one or more spacer elements 335a, 335b, which not only provide a thermal conduction path for the die 315 in regions of lesser heat flux, but also provides provide mechanical stability to the system. When the heat transport relationship between the heat spreader 350 and the region of lesser flux is conduction, the spacer 335a, 335b should be composed of suitably high thermally-conductive material, such as copper. The spacers 335a, 335b may be formed of less thermally conductive material based upon the transport relationship to be maintained. In certain embodiments, such as when the flux in the regions surrounding the hot-spot is very low, the spacers may be formed of a thermally insulating material so as to prevent heat absorbed from the heat transfer body 330 from being transported back to the die 315 via the heat spreader 350. It should be noted also that the spacers illustrated separately as elements 335a and 335b may be formed in a continuous layer around the heat transfer body 330.

Such as is shown in the exemplary embodiment of FIG. 3A, heat spreader 350, which, as known in the art, may be a thermally conductive field of the integrated circuit package may be placed in thermal contact with a suitable heat sink 370. Alternatively, the heat sink 370 may be replaced with an active thermal device, such as a cold plate, when more aggressive thermal management is warranted.

In keeping with known thermal management practice, interfaces between thermally conductive elements may be coated with a suitable thermal interface material, as shown at 325, 340 and 360, such as thermal grease or thermally conductive cement. In the illustrative embodiment FIG. 3A, such interface material is not shown at contact 321, but any application of a thermal interface material applied to either side thereof is within the scope of the invention, although is not generally necessary.

Figure 3B:
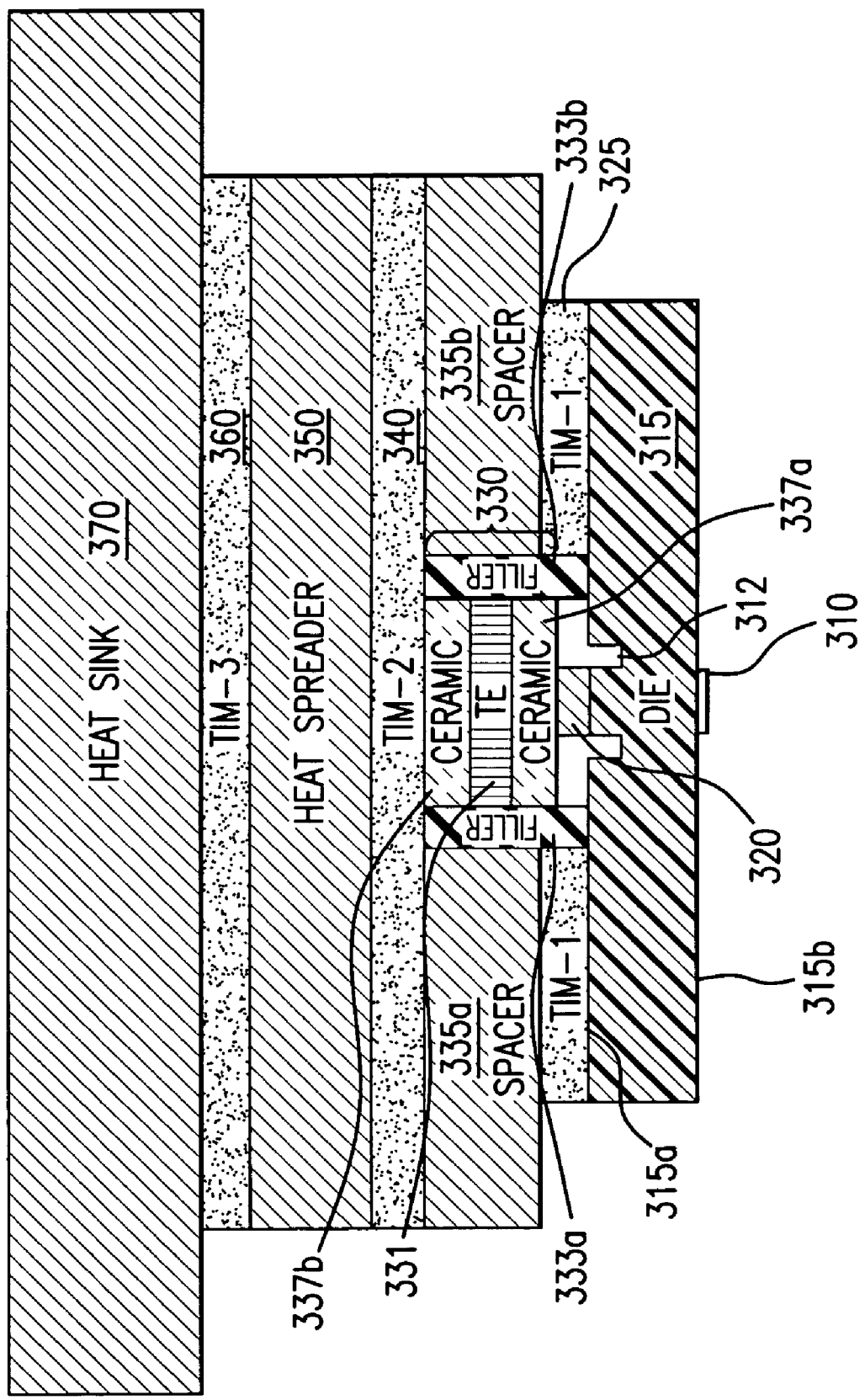
FIG. 3B is a schematic block diagram of an exemplary embodiment of a thermal management system having a mini-contact in accordance with the present invention.

Recent developments in solid state thermoelectric coolers (TECs) have shown some promise for hot-spot thermal management because of their compact size, their lack of moving parts, their high reliability and their ability to precisely control the chip temperature. Severely limiting the applications of TECs to effective hot-spot management, however, is their low cooling flux. Thus, certain embodiments of the invention concentrate the opposing heat flux of the heat transfer body 330 at the hot-spot by the use of a small thermal conductor 320, which will be referred herein as a mini-contact 320. Such an embodiment is illustrated in FIG. 3B, where elements in common with those of FIG. 3A are referred to with like references. Mini-contact 320 is terminated at the boundary 315a at the localized region of elevated heat flux and defines the conduction path between the region of the hot-spot 310 and the heat transfer body 330. It is to be observed that the area mini-contact 320 in contact with heat transfer body 330 is smaller than the bounded surface from which the opposing heat flux emanates from the heat transfer body 330. Not only does this arrangement increase the opposing heat flux at the hot-spot, but also decreases the thermal load on the heat transfer body 330.

In certain embodiments of the invention, the localized region of elevated heat flux is surrounded by a trench 312 to define the contact region of mini-contact 320. The trench 312 serves to improve the cooling at the hot-spot in that it reduces the parasitic heat load from the surrounding die on the thermal body 330. For example, in the cooling application of FIG. 3B, the TE cooling flux is guided by the presence of the trench 312 deeper into the die 315. In certain applications, such as that shown in FIG. 3B where the hot-spot is located on the side 315b of the die 315 opposite the thermal management system 300, a greater amount of cooling flux is delivered to hot-spot 310 in the presence of the trench 312.

The cooling flux at the mini-contact 320 has been shown to be positively correlated with the ratio between the area of the base of heat transfer body 330 and the area of the mini-contact 320. In fact, the cooling flux at the mini-contact 320 may be in excess of ten times that in the base of the thermoelectric cooler, and can even be comparable to the heat flux emanating from an inactive side of the die 315, i.e., the side of the die opposite the hot-spot 310. For dies of typical thickness, the heat flux in the inactive side of the die 315 is generally several times lower than directly at the hot-spot due to heat spreading.

Figure 4:
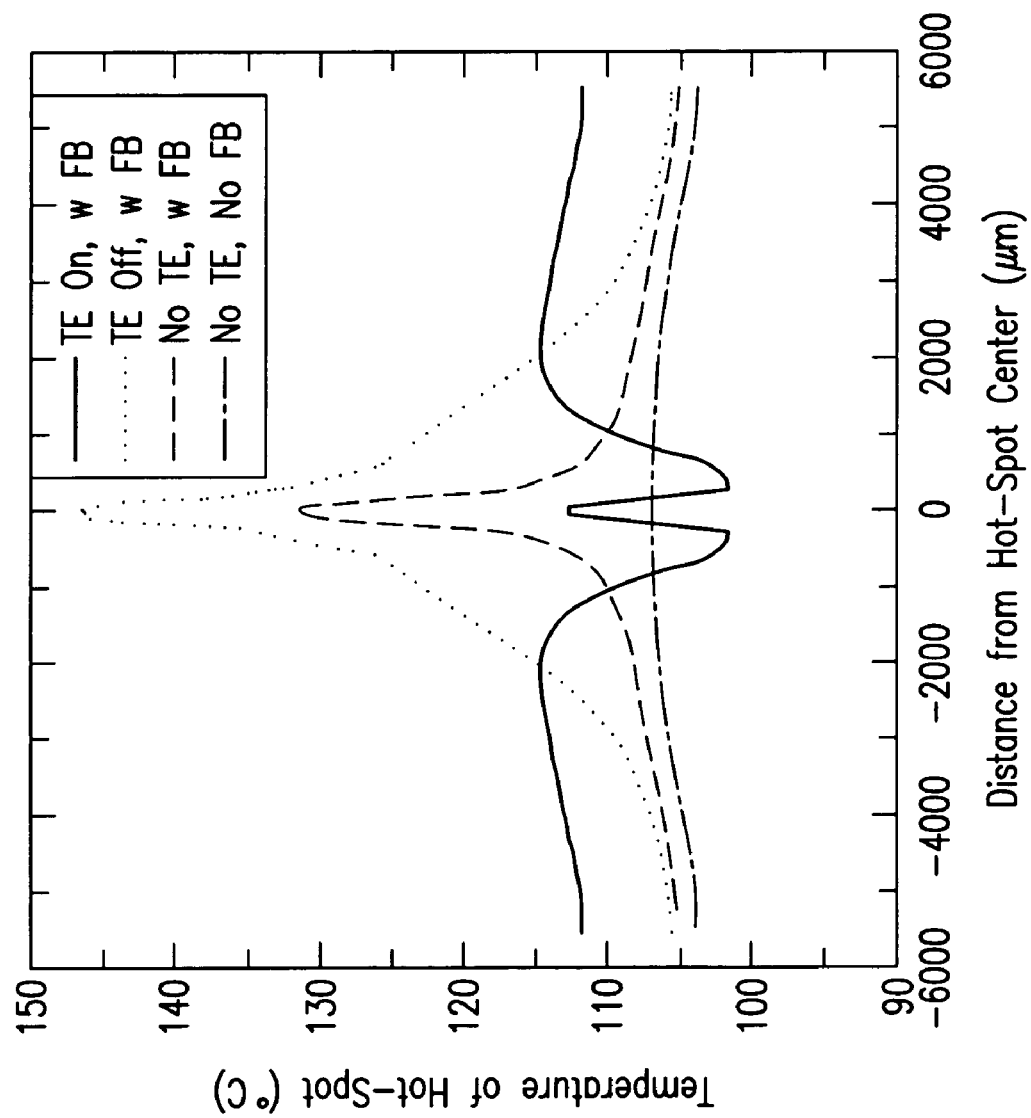
FIG. 4 is a graph of temperature profiles illustrating features of the present invention.

The performance of the thermal management system 300 of the present invention is illustrated graphically in FIG. 4. The thermal profile of a conventional circuit die absent a hot-spot is represented by the dot-dashed line and the addition of a hot-spot produces the profile represented by the dashed line. As is shown by the Figure, the hot-spot introduces a localized region where the temperature is approximately 25° C. higher than the surrounding regions. The planar dimensions of the localized region is approximately 400 μm×400 μm, through which the significantly elevated heat flux level, approximately 1,250 W/cm², flows.

Introduction of the thermal management structure 300 produces the thermal profiles of the dotted line, where the TEC is de-energized and the solid line, where the TEC is energized. In the exemplary embodiment, the mini-contact 320 is 1 mm×1 mm and a trench 312 of approximately 300 μm deep is formed around the mini-contact 320. The peak temperature in the mere presence of the inactive thermoelectric cooler/mini-contact structure, i.e., without power applied, is substantially higher than the temperature of the hot-spot absent the cooler. This increase is due to the additional thermal resistance introduced by the TEC. It is to be also noted that the temperature profile exhibits significant spreading due to the lateral dimensions of the cooler in view of its thermal resistance over that dimension.

When the miniaturized TEC is activated, the peak temperature at the hot-spot is reduced from 146.5° C. to 112.8° C., 19° C. lower than the hot-spot temperature in the conventional chip package without the TEC. This dramatic cooling at the hot-spot is attributed to the combined effects of the mini-contact 320 and the trench 312, but mainly to the mini-contact 320. A more locally complex temperature variation is also created that includes a cooler ring around the hot-spot and a second ring with a slightly elevated temperature surrounding the hot-spot. As is shown in the Figure, there is a relatively modest increase in the temperature of certain regions of the die caused by the extra TEC power consumption and the blockage by the TEC.

The ratio of the TEC's intrinsic cooling ability to the temperature rise engendered by the presence of the hot-spot, given by $$\Delta T_{eff} = \frac{T_{No\,TE,wHS} - T_{TE\,On,wHS}}{T_{No\,TE,wHS} - T_{No\,TE,No\,HS}},$$

can be used to quantify the effectiveness of the TEC in removing a hot-spot. $\Delta T_{eff}=1$ indicates that the temperature rise due to the hot-spot is totally removed by the TEC, while $\Delta T_{eff}=0$ indicates that the TEC is totally ineffective for hot-spot removal. $\Delta T_{eff}<0$ implies that the presence of the TEC results in net heating on the hot-spot, rather than net cooling. In thermal management of chip packages with exemplary system 300, 76% of the hot-spot temperature rise of 25° C. can be removed from the hot-spot (1250 W/cm², 400 μm×400 μm hot-spot) on a 750 μm thick die at the expense of a relatively modest increase in the average die temperature, which corresponds to $\Delta T_{eff}=0.76$.

Figure 5B:
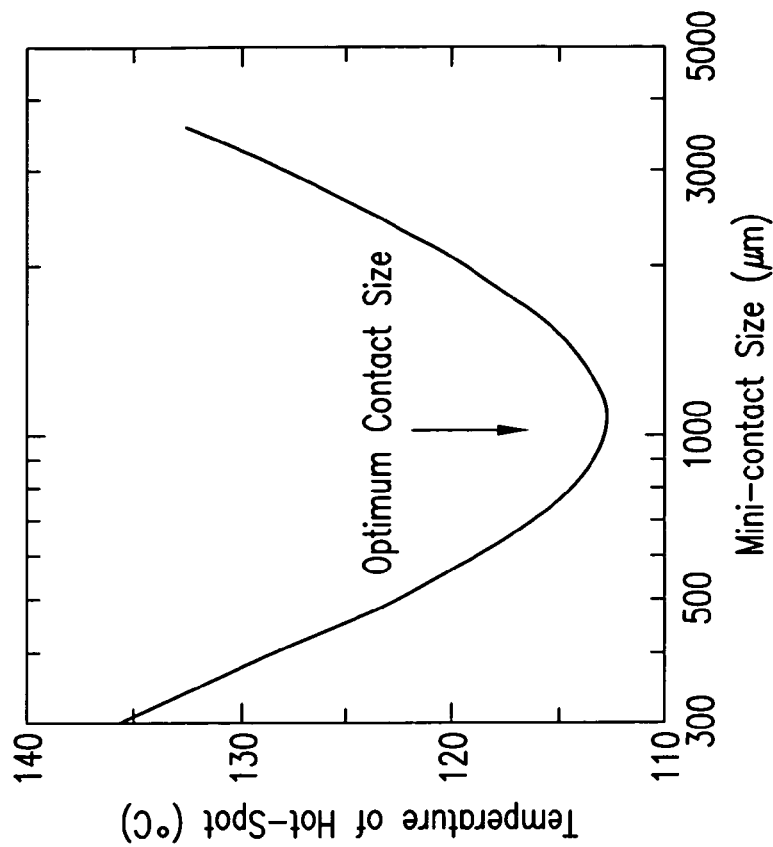
FIG. 5B is a graph illustrating the selection of an optimal contact size for certain embodiments of the present invention.

In accordance with the invention, the mini-contact is sized to concentrate the cooling flux provided by the TEC at the hot-spot. However, as the dimensions of the mini-contact become smaller, although the cooling flux increases at the mini-contact dramatically, the spreading resistance to the cooling flux also increases. Thus, there is an optimum size for the mini-contact for optimal cooling at the hot-spot. This optimum is graphically depicted in FIG. 5B, where it is shown that for the thermal management configuration 300 of FIG. 3, the mini-contact 320 should be 1 mm×1 mm when the base of the TEC is 3.6 mm×3.6 mm. It is to be noted that the change in the size of the mini-contact will not affect the total cooling power, but will rather redistribute the cooling flux underneath the hot-spot.

Figure 5A:
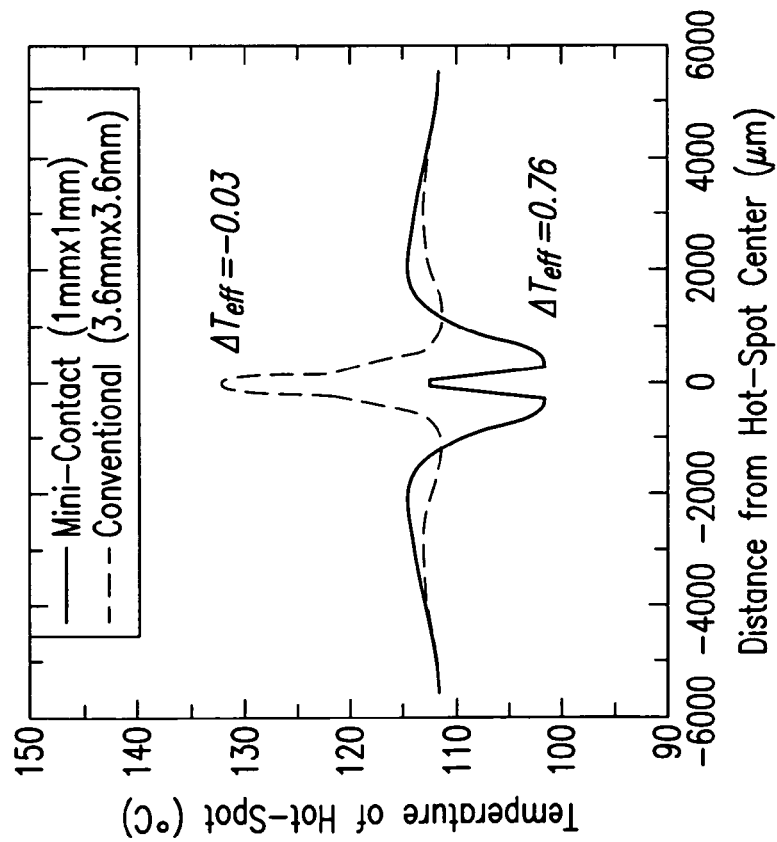
FIG. 5A is a temperature profile graph comparing traditional thermal management systems to embodiments of the present invention.

FIG. 5A illustrates the difference between the thermal management system of the present invention and the traditional thermoelectric contact coolers of the prior art. As is shown in FIG. 5A, the temperature distribution on the die changes when the TE contact size is reduced from 3.6 mm×3.6 mm (the TEC's base dimensions) to 1 mm×1 mm (the optimum contact size). It is to be noted that the peak temperature at the hot-spot decreases significantly in the presence of the mini-contact and the temperature surrounding the hot-spot increases slightly. Significantly, $\Delta T_{eff}$=−0.03 in the chip package with the conventional thermal management contact as compared to $\Delta T_{eff}$=0.76 for the same chip package with the thermal management system of the present invention installed. This finding is consistent with the conclusion that TECs with conventional-sized contact areas are not capable of cooling down the high heat flux hot-spot on a die and that the chip package with the thermal management system of the present invention offers much better hot-spot cooling performance than the TEC with the conventional contact.

Figure 6:
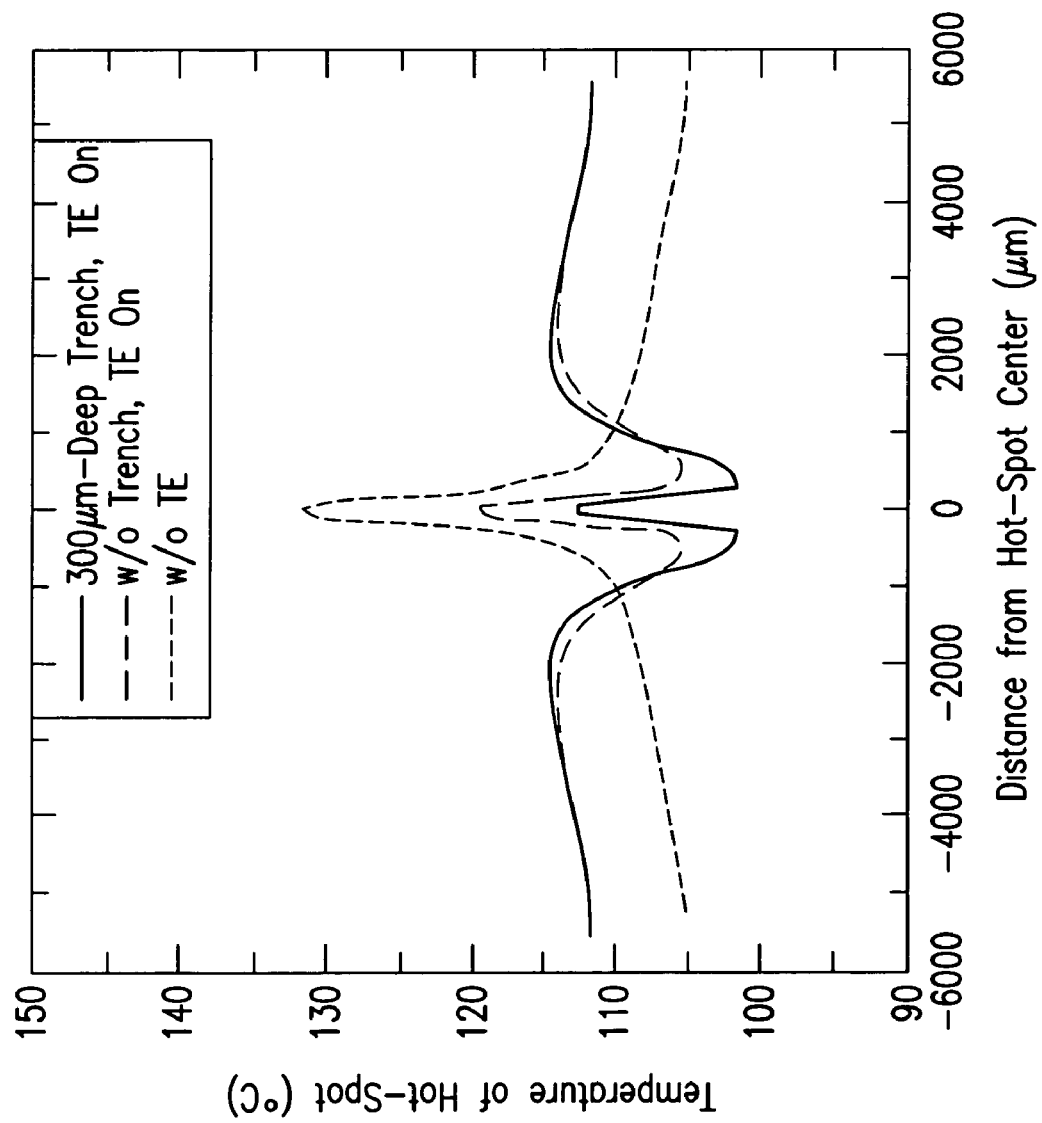
FIG. 6 is a graph of temperature profiles illustrating the effects of adding a trench adjacent to a contact region of embodiments of the present invention.

As was discussed in the context of FIG. 3B, a trench 312 is optionally formed around the hot-spot location in certain embodiments of the present invention. The trench etched around the mini-contact further improves the cooling at the hot-spot, because it reduces the parasitic heat load from the surrounding die on the TEC. The TE cooling power can be guided by the trench to cool the hot-spot more effectively. As shown in FIG. 6, the introduction of a 300 μm deep trench reduces the hot-spot temperature from 119.6° C. to 112.8° C. in the exemplary thermal management package 300 of FIG. 3B. The negative effect of the trench structure is shown as the elevated temperature increase around the hot-spot, however, this increased temperature is very small.

The trench structure is not a necessary element to the thermal management of the present invention. For example, if the cooling power of the thermoelectric cooler can be increased, the same cooling power performance at the hot-spot can be achieved without the trench etched in the die. For example, an increase from 5 W to 6.12 W provides enough cooling power to cool a hot-spot on a 125 μm thick die without the optional trench.

Figure 7B:
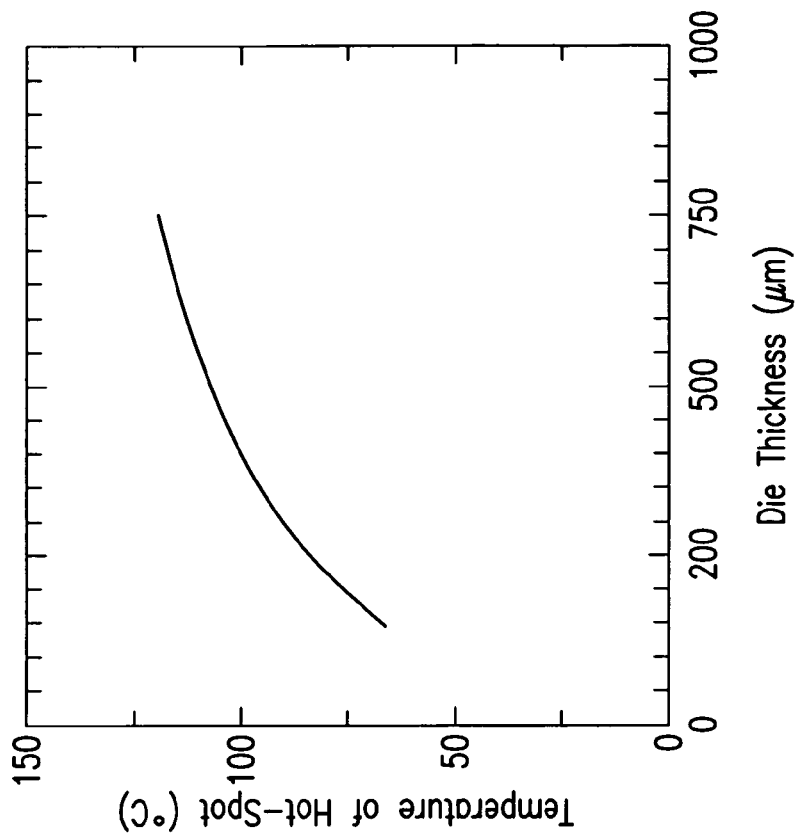
FIGS. 7A and 7B are graphs illustrating the effects of die thickness on the efficiency of embodiments of the present invention.
Figure 7A:
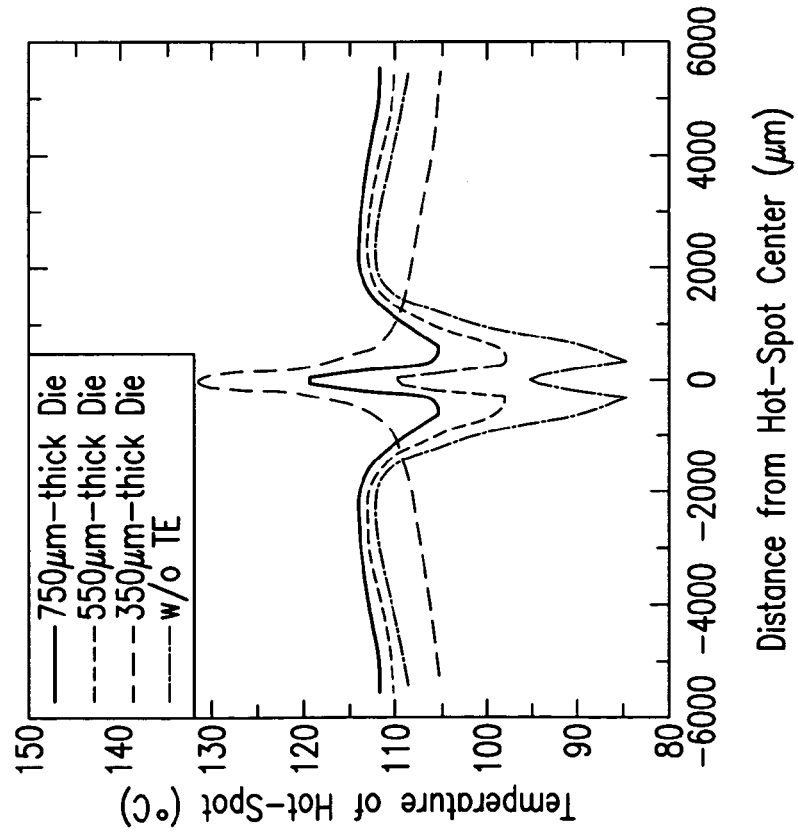

As shown in FIG. 7B, the thickness of the die has a significant impact on the temperature on the hot-spot. It has been shown that for thinner circuit dies, the parasitic heat load on the TEC is smaller and better cooling is provided at the hot-spot. FIG. 7A illustrates the hot-spot temperature decrease for thinner dies when other parameters remain the same.

Figure 8:
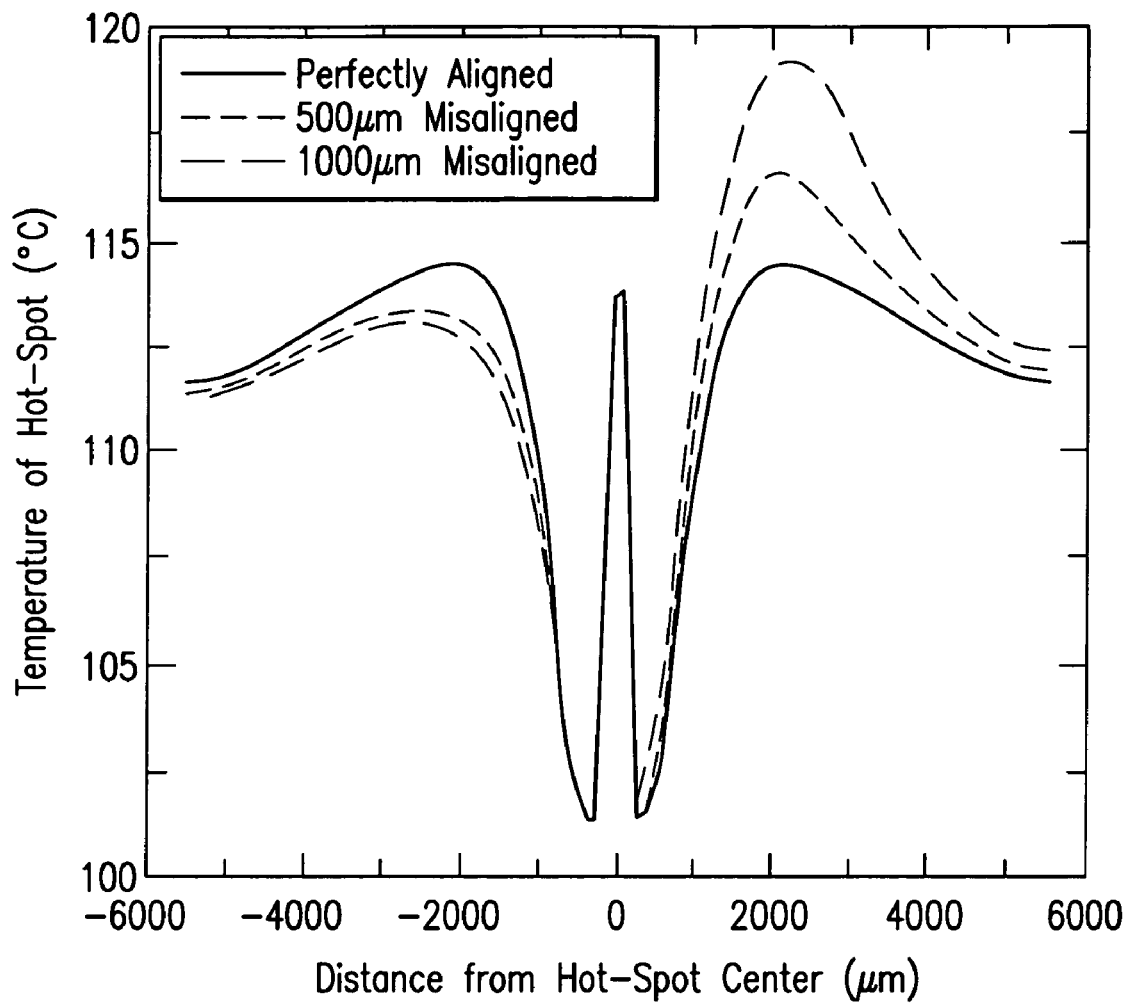
FIG. 8 is a graph of temperature profiles illustrating the effect of alignment of the contact region of embodiments of the present invention to the localized region of elevated flux.

Referring to FIG. 8, there is shown that misalignment of the TEC relative to the mini-contact has little effect on the hot-spot cooling. There is a marginal temperature increase on the side of the hot-spot where the TEC is located, resulting in about a 4° C. increase for a 500 micrometer misalignment. The misalignment may occur for many reasons such as low positioning accuracy in the fabrication equipment and the slipping of the TEC due to thermal stress, vibration and/or shock. Fortunately, the insensitivity of the hot-spot cooling of the present invention to the TEC misalignment greatly simplifies the fabrication and assembly process and increases the package reliability.

The thermal management structure of the present invention may be fabricated by known fabrication techniques. The mini-contact may be fabricated using electrochemical deposition and a trench around the mini-contact can be etched using the deep reactive ion etching (DRIE) technique. The miniaturized TE module may be chosen for a given chip package and package assembly may be done robotically or under observation of an optical microscope.

Figure 9A:
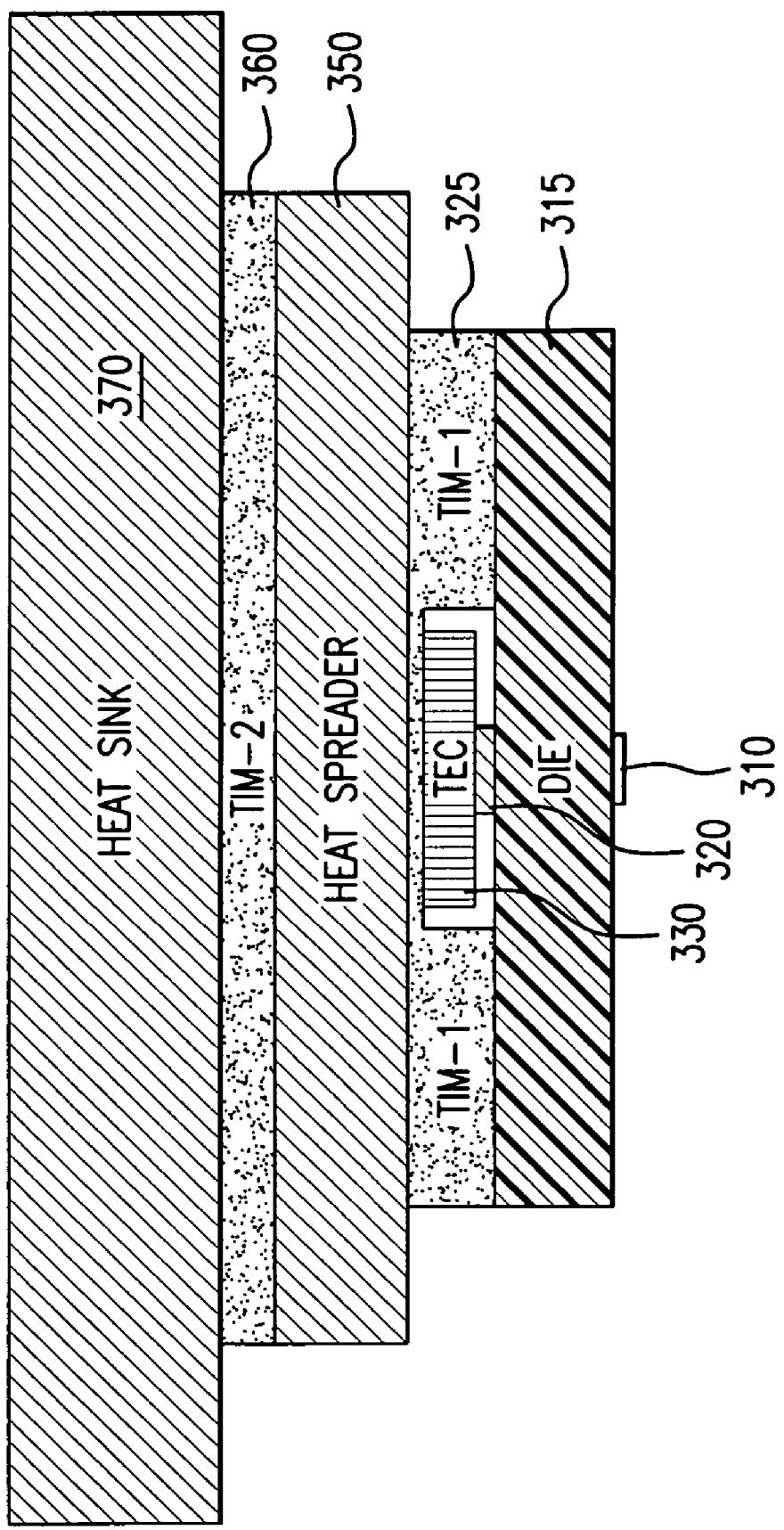

Numerous embodiments are within the scope of the present invention. For example, FIG. 9A, where like numerals refer to the same elements in FIGS. 3A and 3B, depicts an exemplary embodiment in which the TEC 330 is integrated into the TIM layer 325. Such integration may include a thin layer of material to separate the TEC 330 from the heat spreader 350, such as is depicted in FIG. 9A. Alternatively, the TEC 330 may be surrounded by the TIM layer 325 while in physical contact with the heat spreader 350, such as is depicted in FIG. 9E.

Figure 9B:
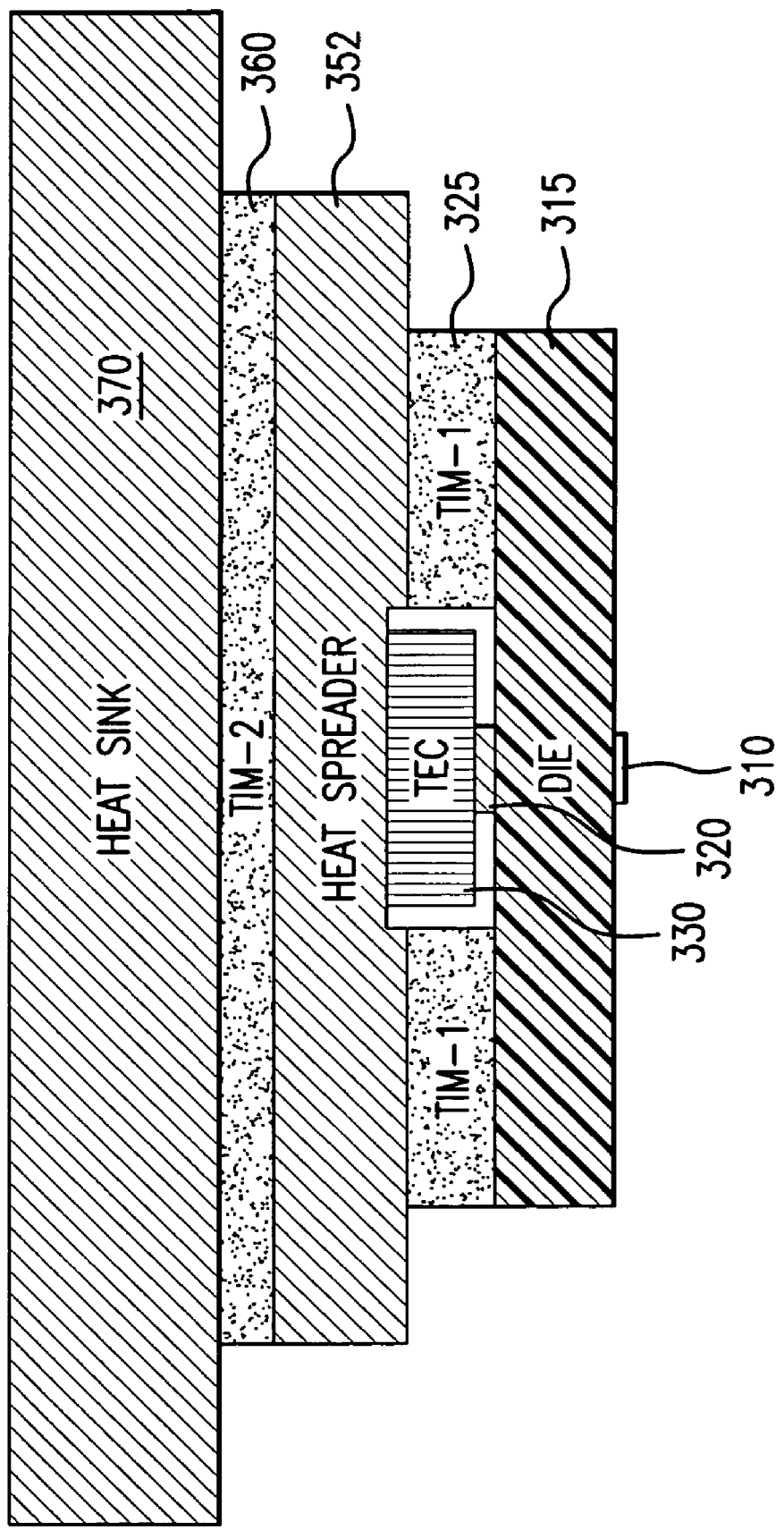

In the exemplary embodiment of FIG. 9B, the TEC 330 is integrated into the heat spreader 350. Such arrangements allow separation of manufacturing tasks, e.g., the adaptation of the thermoelectric device to the package may be performed at a packaging station while the mini-contact 320 is fabricated on the die at a circuit fabrication station.

Figure 9C:
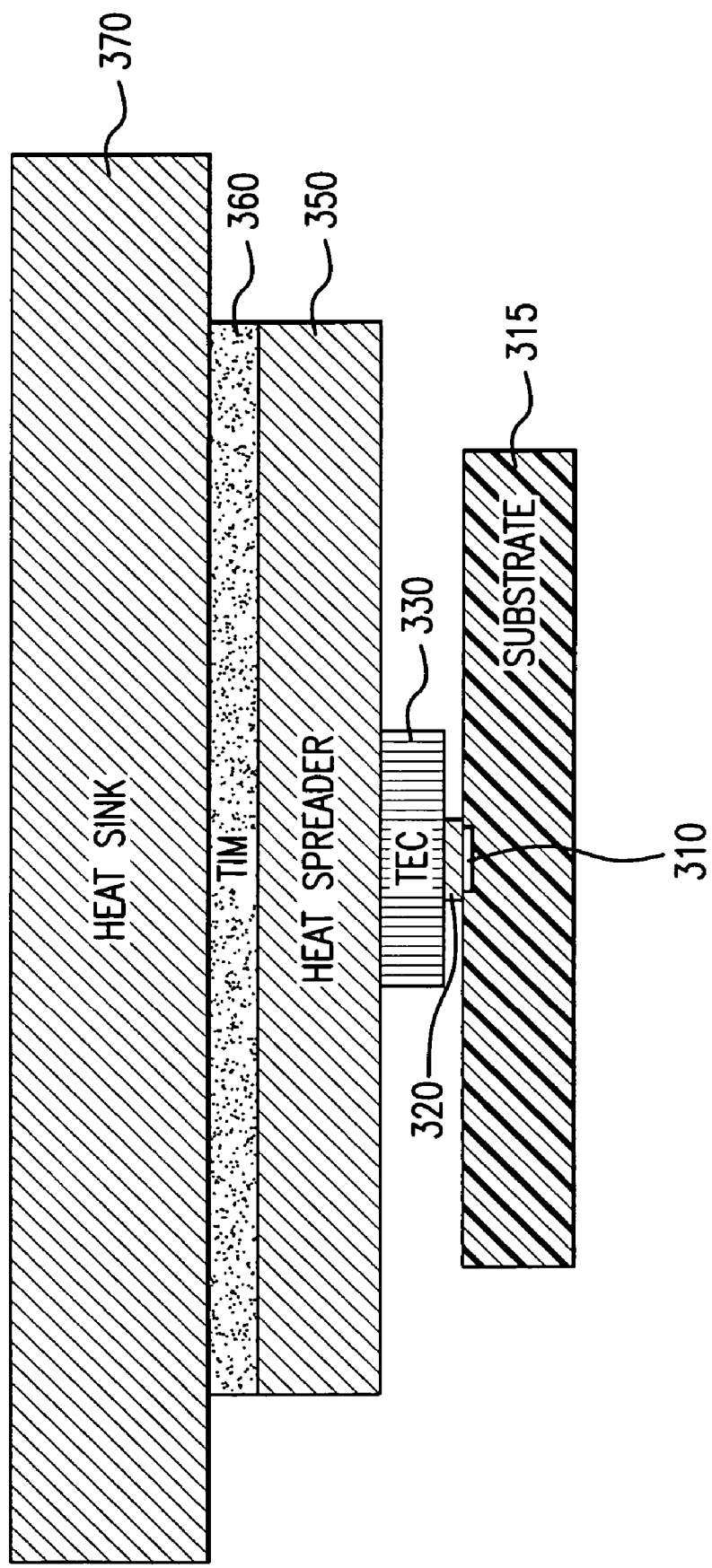
Figure 9D:
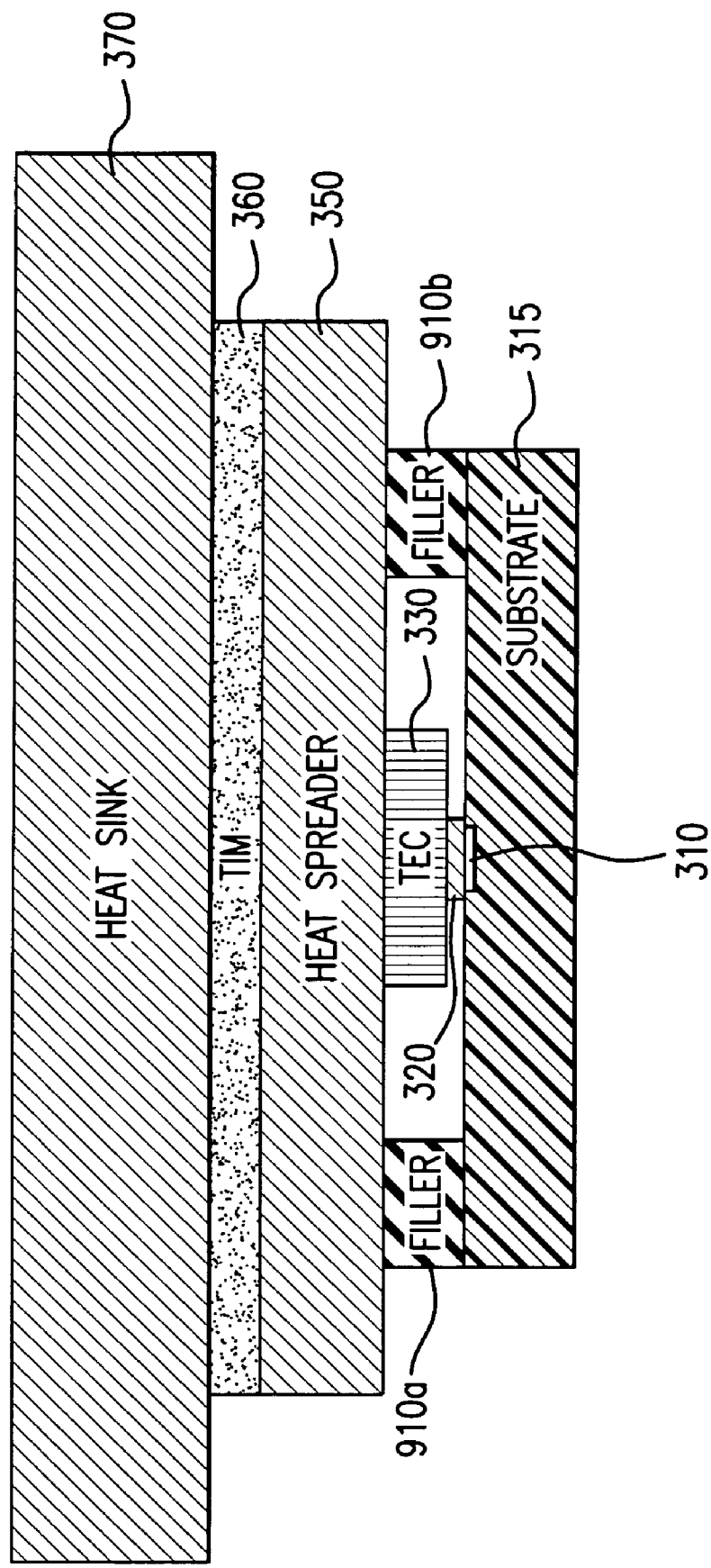
Figure 9E:
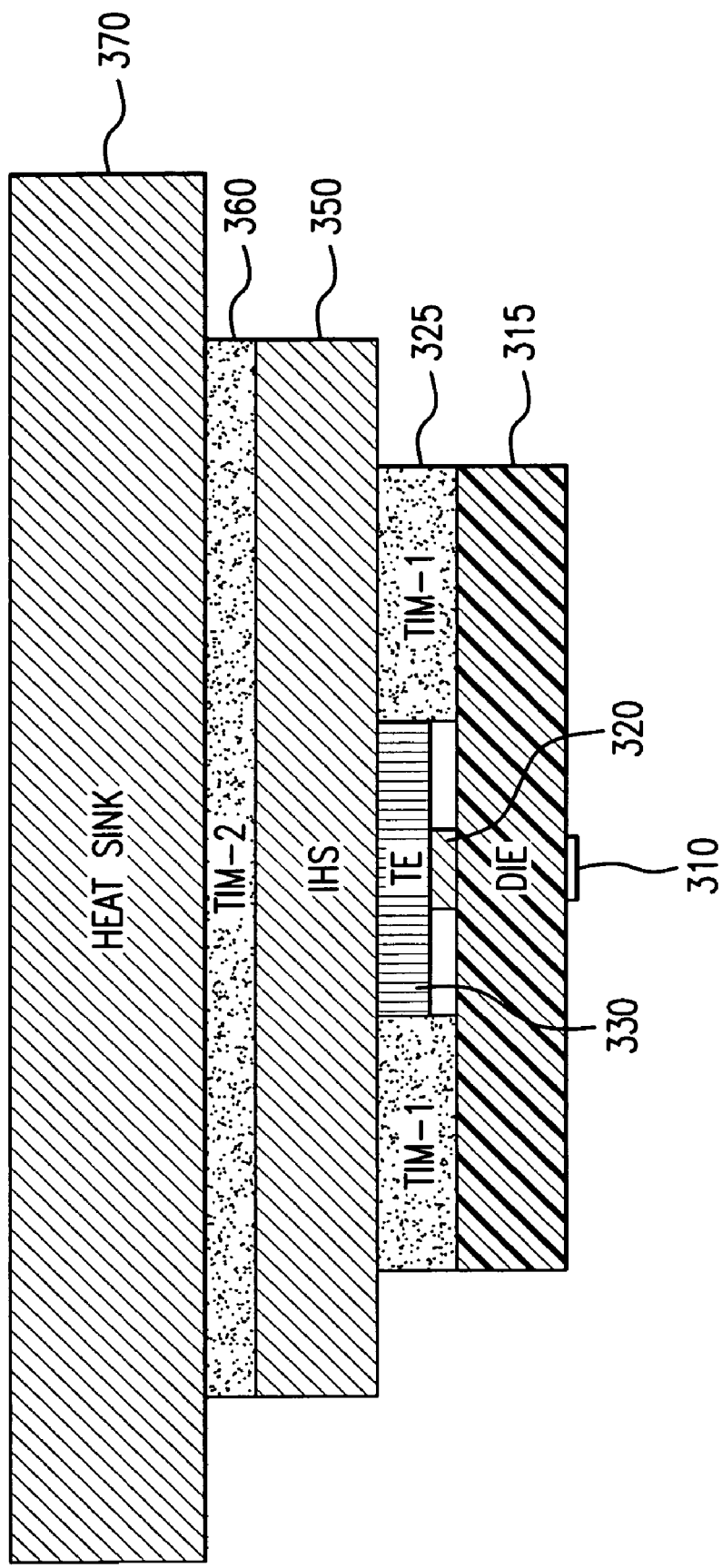

As stated above, the thermal management system of the present invention may be installed on either side of the circuit die 315. FIGS. 9C and 9D illustrate such configuration. In FIG. 9C, the mini-contact 320 is in direct communication with the hot-spot 310 and is the lone thermal conduction path through the system from hot-spot 310. The configurations where alternative conduction paths are not required have application where background heat in the substrate 315 is low, for example, in a semiconductor laser application where the temperature of the laser is much higher than the surrounding substrate. FIG. 9D illustrates a similar configuration, except a low thermal conductivity filler layer shown at 910a, 910b is formed to increase the mechanical stability of the structure. As previously discussed, spacers of low thermal conductivity may be used where the flux in the regions surrounding the hot-spot are low and the thermal transport relationship between the heat spreader 350 and the low flux regions of the die is one that prevents heat from being transferred from the heat spreader 350, as heated by the TEC 330, to the die 315.

Figure 9G:
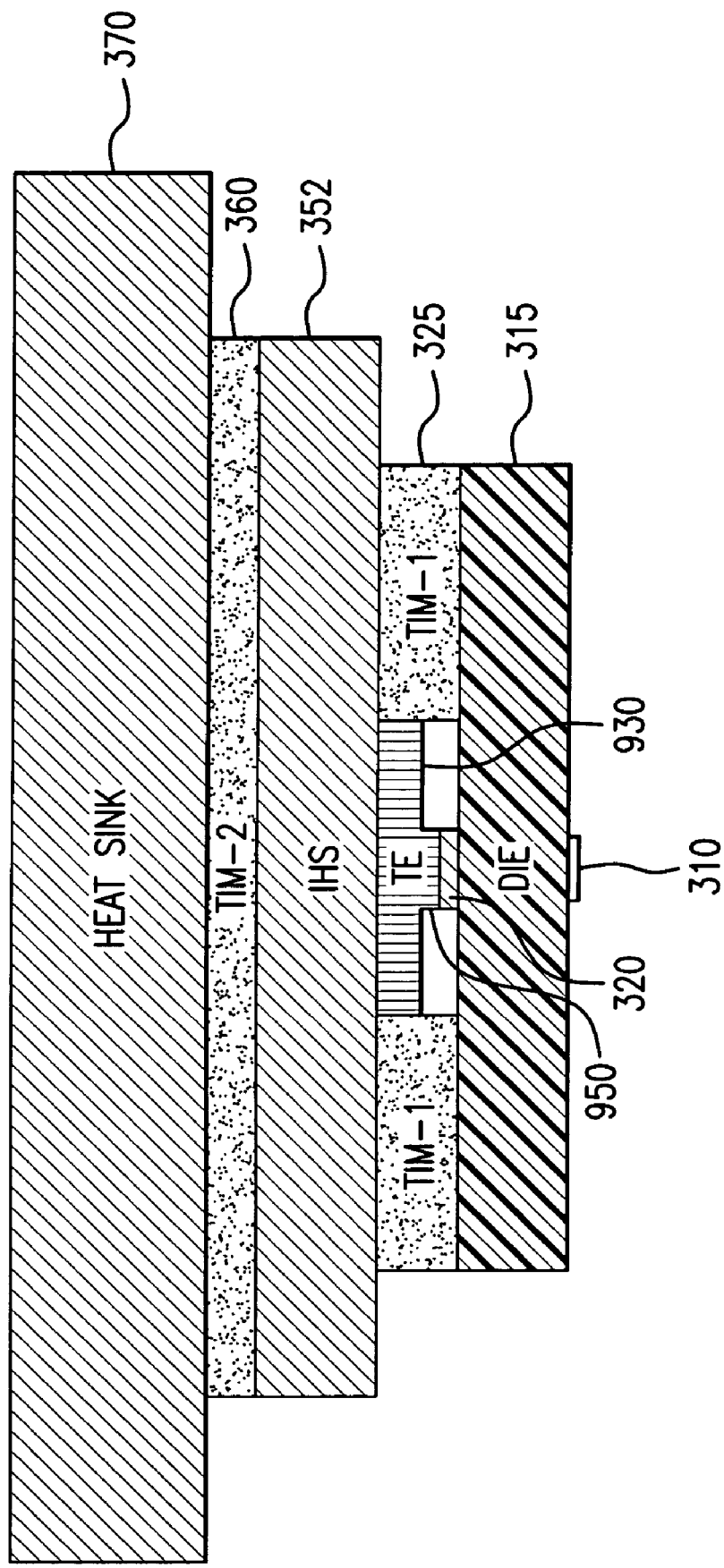

In certain embodiments of the invention, the thermal electric cooler may have a region integrally formed thereon to serve as the contact with the die 315, such as is shown in FIG. 9F. As is shown in the Figure, TEC 930 has a protrusion 950 formed on its surface. The protrusion extends to the die 315 and is in physical contact therewith. Alternatively, as is shown in FIG. 9G, a mini-contact 320 of high thermal conductivity may be interposed between the protrusion 950 of TEC 930 and the die 315. It is to be understood that while the protrusion 950 is shown as being defined by stepped transition from the surface of TEC 930, other protrusion shapes are possible and considered to be within the scope of the present invention.

Figure 9H:
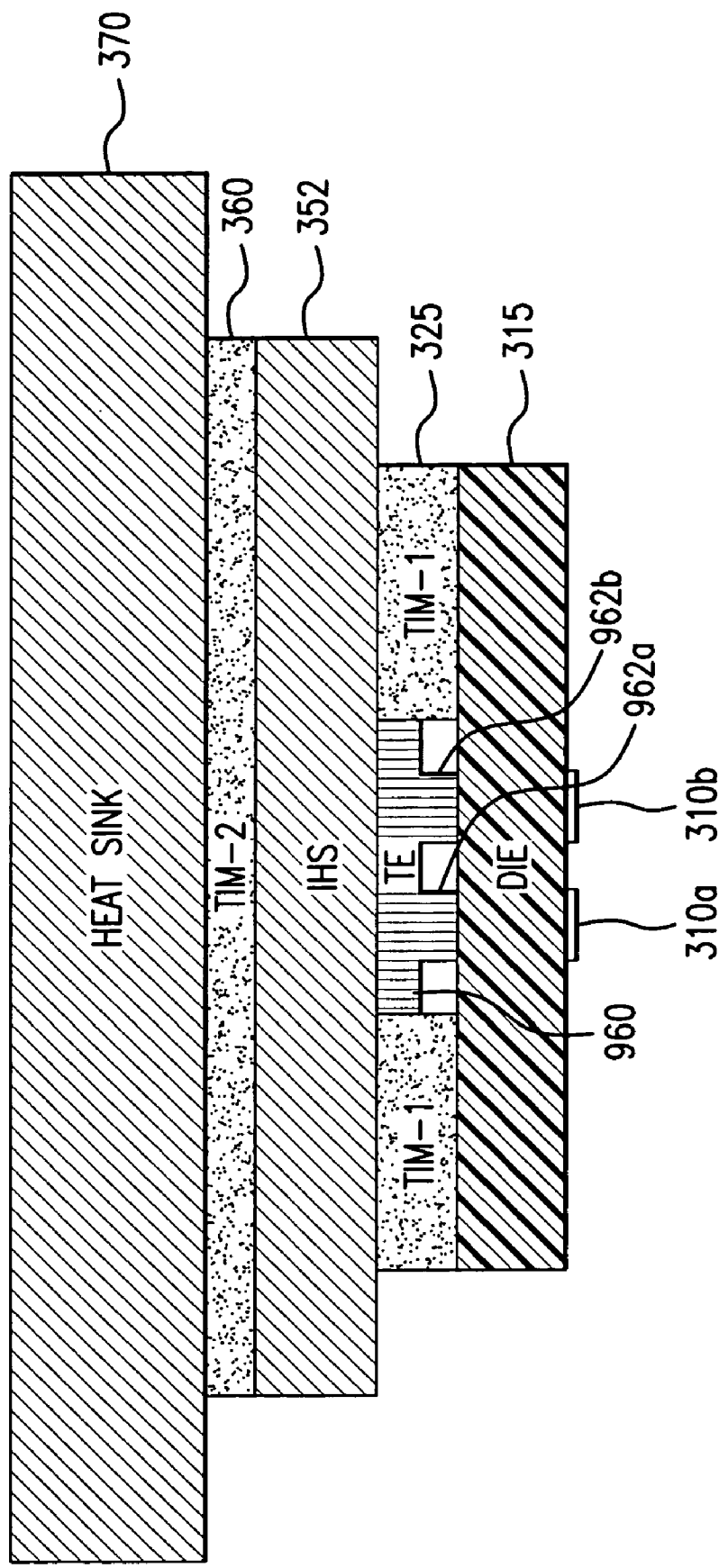
Figure 9I:
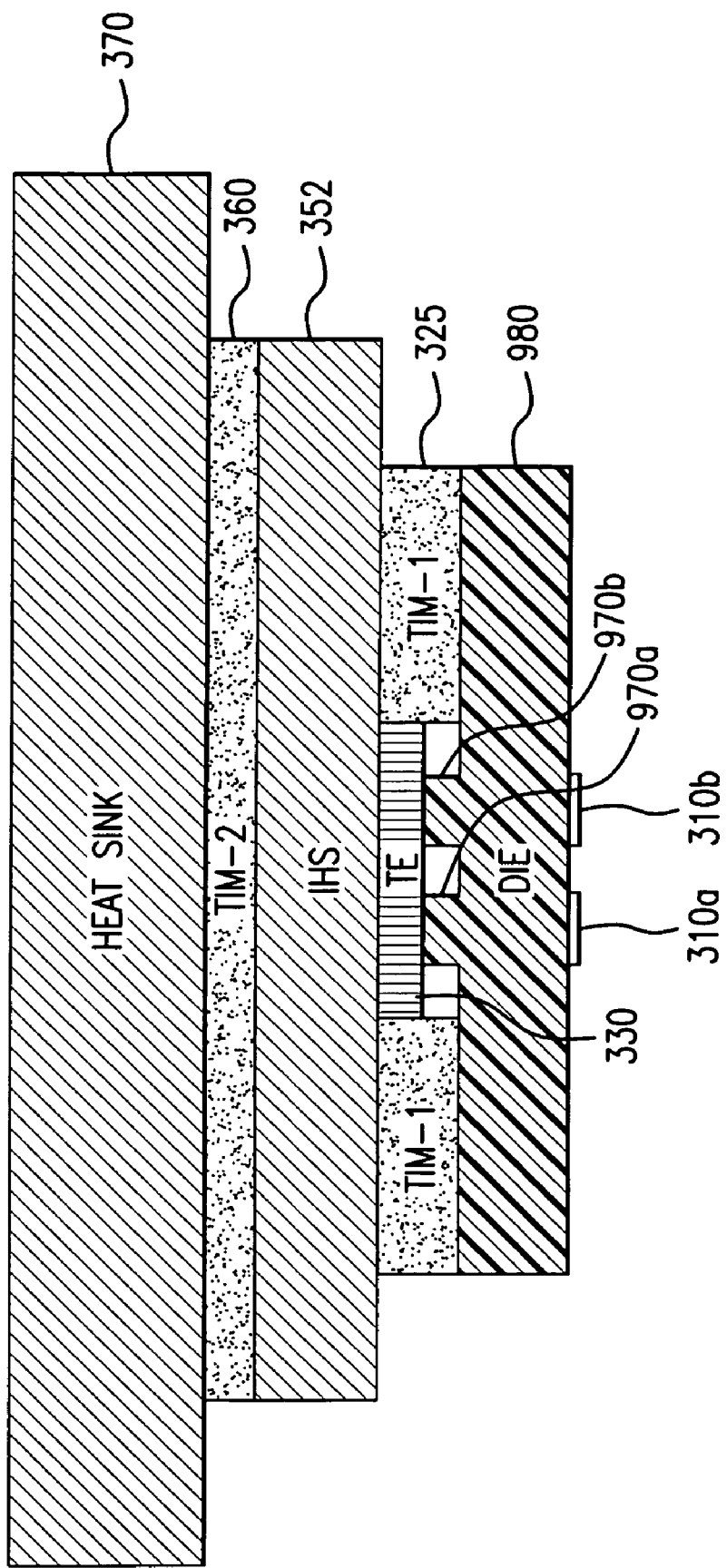

Multiple hot-spots may be cooled by a single TEC in accordance with embodiments of the invention, such as is shown in FIGS. 9H and 9I. Referring first to FIG. 9H, TEC 960 may include a plurality of protrusions 962a, 962b formed on its surface. Each protrusion 962a, 962b is provided to cool respective hot-spots 310a, 310b in a manner previously described. It is to be noted that while only two protrusions are shown in FIG. 9H, other numbers of protrusions are possible and considered within the scope of the invention. Further, it is to be understood that the distribution of protrusions on the TEC 960 need not be uniform and spacing between protrusions will vary by application.

Referring now to FIG. 9I, there is shown an alternative configuration for the thermal management system of the present invention. As is shown in the Figure, die 980 includes protrusions 970a, 970b located at hot-spots 310a, 310b. The protrusions may be formed on the die by known manufacturing techniques so as to form a thermal conduction path to the TEC 330. It is to be understood that any number of protrusions may be formed according to the number of hot-spots to be cooled, including where only a single protrusion is formed. Additionally, although not shown in the Figure, a mini-contact of high thermal conductivity, such as described above, may be interposed between the protrusions 970a, 970b and the TEC 330.

Figure 10:
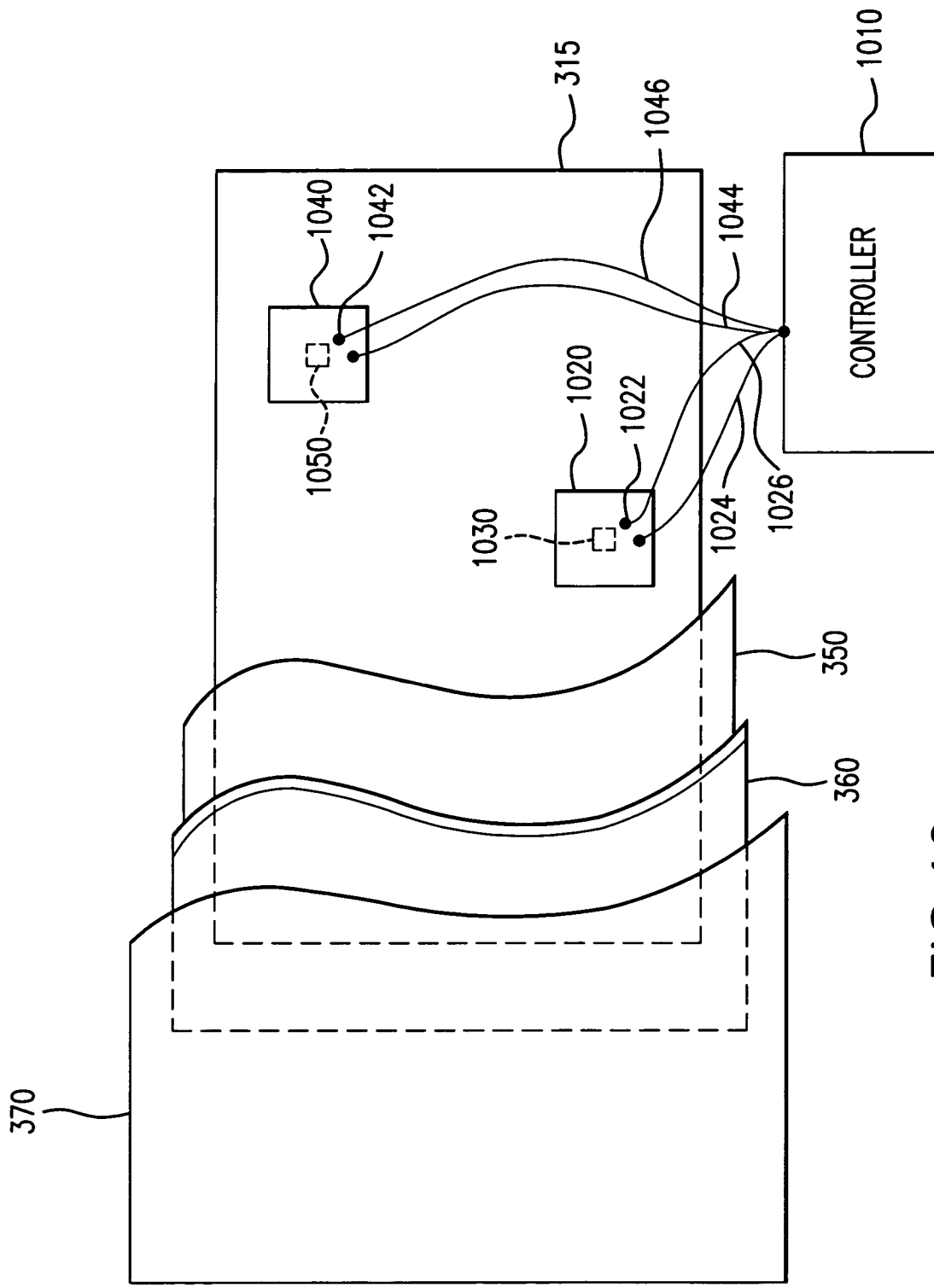
FIG. 10 is a schematic block diagram of another alternative embodiment of the present invention.

A further embodiment is illustrated in FIG. 10, which illustrates a top-down view of the thermal management system and like elements to those previously described are referenced with like numerals. In the exemplary embodiment of the Figure, a plurality of TECs, indicated at 1020 and 1040, are positioned at corresponding localized regions of elevated heat flux. It should be noted that for IC applications, each of the localized regions will correspond to a hot-spot, however other applications involving cold-spots, or even mixes of hot-spots and cold-spots are within the scope of the present invention. Each TEC includes a corresponding mini-contact 1030 and 1050, respectively. Power to the TECs may be independently provided or may be provided on a common bus. Furthermore, each TEC may have located thereon a temperature sensor, indicated at 1022, 1042 for measuring the temperature at some reference point. It is to be noted that the reference point may be located on the circuit die 315 and not on the body of the TEC.

In certain embodiments of the invention, a controller 1010 is provided for controlling the temperature at each of the localized regions of elevated heat flux. For example, the temperature at each site may be provided to controller 1010 by sensors 1022 and 1042 over signal lines 1026 and 1046, respectively. Based upon the temperature, the controller can provide power over lines 1024 and 1044 to provide the corresponding opposing flux. Controller 1010 may be any appropriate controller known in the art, such as commercially available proportional-integral-derivative (PID) controllers.

The descriptions above are intended to illustrate possible implementations of the present invention and are not restrictive. Many variations, modifications and alternatives will become apparent to the skilled artisan upon review of this disclosure. For example, components equivalent to those shown and described may be substituted therefore, elements individually described may be combined, and elements described as discrete may be distributed across many components. The scope of the invention should therefore be determined not with reference to the description above, but with reference to the appended claims, along with their full range of equivalents.

What is claimed is:

1. A thermal management system for transferring thermal energy across a boundary that includes at least one localized region of elevated heat flux adjacent to, and in uninterrupted thermal and direct, physical contact with a region of lesser heat flux, said region of lesser heat flux integrally and homogeneously formed with said region of elevated heat flux, the thermal management system comprising:

an actively operable first heat transfer body having at least one first region terminated by the boundary at substantially the localized region of elevated heat flux and a second region displaced from physical contact with the boundary, said first region and said second region formed integrally one with another in said first heat transfer body, said second region being disposed substantially perpendicular to the flow of thermal energy through said boundary and through said at least one first region, wherein the flow of thermal energy traverses said second region in the same direction as said boundary; said first heat transfer body acting by an opposing heat flux in an opposing heat transport relationship with respect to the localized region of elevated heat flux; and a passively operable second heat transfer body being in heat transport relationship with said first heat transfer body and with the region of lesser heat flux; said thermal management system simultaneously providing both active and passive heat transport.

2. The thermal management system as recited in claim 1 further including a parasitic heat-reducing trench formed in the boundary adjacent said first region; said trench for reducing a parasitic heat load on the first heat transfer body, wherein the parasitic heat load is produced in the region of lesser heat flux.

3. The thermal management system as recited in claim 1 further including a thermal conductor defining a thermal conduction path between said second heat transfer body and the region of lesser heat flux.

4. The thermal management system as recited in claim 1, wherein said First heat transfer body extends into a surface of said second heat transfer body.

5. The thermal management system as recited in claim 1, wherein said first heat transfer body is at least partially embedded into a layer of thermal interface material.

6. The thermal management system as recited in claim 1 further including a third heat transfer body in heat transport relationship with said second heat transfer body.

7. The thermal management system as recited in claim 1, wherein said first region protrudes from said second region through a stepped transition.

8. The thermal management system as recited in claim 1, wherein the first heat transfer body is a thermoelectric device.

9. A thermal management system for transferring thermal energy across a boundary that includes at least one localized region of elevated heat flux adjacent to, and in uninterrupted thermal and direct, physical contact with a region of lesser heat flux, said region of lesser heat flux integrally and homogeneously formed with said region of elevated heat flux, the thermal management system comprising:

a first layer on a first side of the boundary;

a second layer on a side of the boundary opposing said first side thereof, said second layer including an actively operable first heat transfer body for providing an opposing heat flux in opposing thermal transport relationship to the heat flux in the localized region, said first heat transfer body including at least one first region in physical contact with the boundary substantially at the localized region of elevated heat flux and a second region displaced from physical contact with the boundary, said first region and said second region formed integrally one with another in said first heat transfer body; said second region being disposed substantially perpendicular to the flow of thermal energy through said boundary and through said at least one first region, wherein the flow of thermal energy traverses said second region in the same direction as said boundary; and a third layer including a passively operable second heat transfer body, said second layer being in heat transport relationship with said first heat transport body and with the region of lesser heat flux; said thermal management system simultaneously providing both active and passive heat transport.

10. The thermal management system as recited in claim 9, wherein said first layer includes a parasitic heat-reducing trench formed therein at the boundary and adjacent said at least one first region of said first heat transfer body; said trench for reducing a parasitic heat load on the first heat transfer body, wherein the parasitic heat load is produced in the region of lesser heat flux.

11. The thermal management system as recited in claim 9, wherein said third layer includes a contact region located at the region of lesser heat flux, said contact region displaced from physical contact with said first region.

12. The thermal management system as recited in claim 11 further including a thermal conduction layer between said first layer and said third layer for conducting the lesser heat flux through said contact region to said second heat transfer body.

13. The thermal management system as recited in claim 9, wherein said first region of said first heat transfer body protrudes from said second region thereof.

14. The thermal management system as recited in claim 9, wherein said first layer includes at least one protrusion in physical contact with said first heat transfer body at said at least one first region thereof.

15. The thermal management system as recited in claim 9, wherein the first heat transfer body is a thermoelectric device.

16. A thermal management system for transferring thermal energy across a boundary that includes at least one localized region of elevated heat flux adjacent to, and in uninterrupted thermal and direct, physical contact with a region of lesser heat flux, said region of lesser heat flux integrally and homogeneously formed with said region of elevated heat flux, the thermal management system comprising:
at least one actively operable first heat transfer body acting by a corresponding opposing heat flux in an opposing heat transport relationship with respect to a corresponding localized region of elevated heat flux, said first heat transfer body including a first region protruding from a second region thereof, said first region being located substantially at the corresponding localized region of elevated heat flux; said second region being disposed substantially perpendicular to the flow of thermal energy through said boundary and through said first region, wherein the flow of thermal energy traverses said second region in the same direction as said boundary; and
a passively operable second heat transfer body being in heat transport relationship with said at least one first heat transfer body and with the region of lesser heat flux; said thermal management system simultaneously providing both active and passive heat transport.

17. The thermal management system as recited in claim 16 including at least one first thermal conductor defining a corresponding thermal conduction path between the boundary and said corresponding first heat transfer body, said first thermal conductor being terminated by the boundary at substantially the corresponding localized region of elevated heat flux and terminated by said first region of said corresponding first heat transfer body.

18. The thermal management system as recited in claim 16, wherein said first region is terminated by the boundary at substantially the corresponding localized region of elevated heat flux.

19. The thermal management system as recited in claim 16 further including at least one second thermal conductor defining a thermal conduction path between the region of lesser flux and said second heat transfer body.

20. The thermal management system as recited in claim 16 including a plurality of said first heat transfer bodies.

21. The thermal management system as recited in claim 20, wherein said at least one second heat transfer body is a single second heat transfer body in said heat transfer relationship with all of said plurality of first heat transfer bodies.

22. The thermal management system as recited in claim 20 further including a controller operable to control said corresponding opposing heat flux emanating from each of said plurality of first heat transfer bodies independently each with respect to another.

23. The thermal management system as recited in claim 16, wherein the first heat transfer body is a thermoelectric device.

* * * * *